United States Patent [19]
Inoue et al.

[11] Patent Number: 5,661,052
[45] Date of Patent: Aug. 26, 1997

[54] METHOD OF FABRICATING SEMICONDUCTOR DEVICE HAVING LOW-RESISTANCE GATE ELECTRODE AND DIFFUSION LAYERS

[75] Inventors: Ken Inoue; Makoto Sekine; Hirohito Watanabe; Ichirou Honma, all of Tokyo, Japan

[73] Assignee: NEC Corporation, Tokyo, Japan

[21] Appl. No.: 617,686

[22] Filed: Mar. 19, 1996

[30] Foreign Application Priority Data

Mar. 30, 1995 [JP] Japan ................... 7-072801

[51] Int. Cl.$^6$ ................ H01L 21/283; H01L 21/335
[52] U.S. Cl. .............. 438/303; 438/230; 438/586; 438/595
[58] Field of Search ............ 437/41 GS, 41 SM, 437/41 SW, 192, 193, 200

[56] References Cited

U.S. PATENT DOCUMENTS

| | | | |
|---|---|---|---|
| 5,322,809 | 6/1994 | Moslehi | 437/41 |
| 5,330,925 | 7/1994 | Lee et al. | 437/44 |
| 5,352,631 | 10/1994 | Sitaram et al. | 437/200 |

FOREIGN PATENT DOCUMENTS 3-288443  12/1991  Japan .

*Primary Examiner*—T. N. Quach
*Attorney, Agent, or Firm*—Whitham, Curtis, Whitham & McGinn

[57] ABSTRACT

The method of fabricating a semiconductor device, includes the steps of (a) forming gate oxides on regions separated by device isolation regions, (b) depositing an amorphous silicon or a polysilicon film, (c) depositing a removable space-forming film over the silicon film, (d) patterning the space-forming film and the silicon film into the same shape to form a gate electrode comprising the thus patterned space-forming film and silicon film, (e) depositing a silicon nitride film, (f) etching the silicon nitride film to form a first sidewall around a sidewall of the gate electrode, (g) depositing a silicon oxide film, (h) etching the silicon oxide film to form a second sidewall around and onto the first sidewall, (i) etching the space-forming film with hydrofluoric anhydride for removal so that the silicon film is exposed and the first sidewall remains unremoved, (j) forming source/drain regions, and (k) selectively depositing a refractory metal or metal silicide film on the silicon film and the source/drain regions. The method makes it easy to cause the first sidewall to have higher height than the amorphous or polysilicon film to thereby form low-resistance gate electrode and diffusion layers, resulting in that the gate electrode is not short-circuited with the diffusion layers.

18 Claims, 7 Drawing Sheets

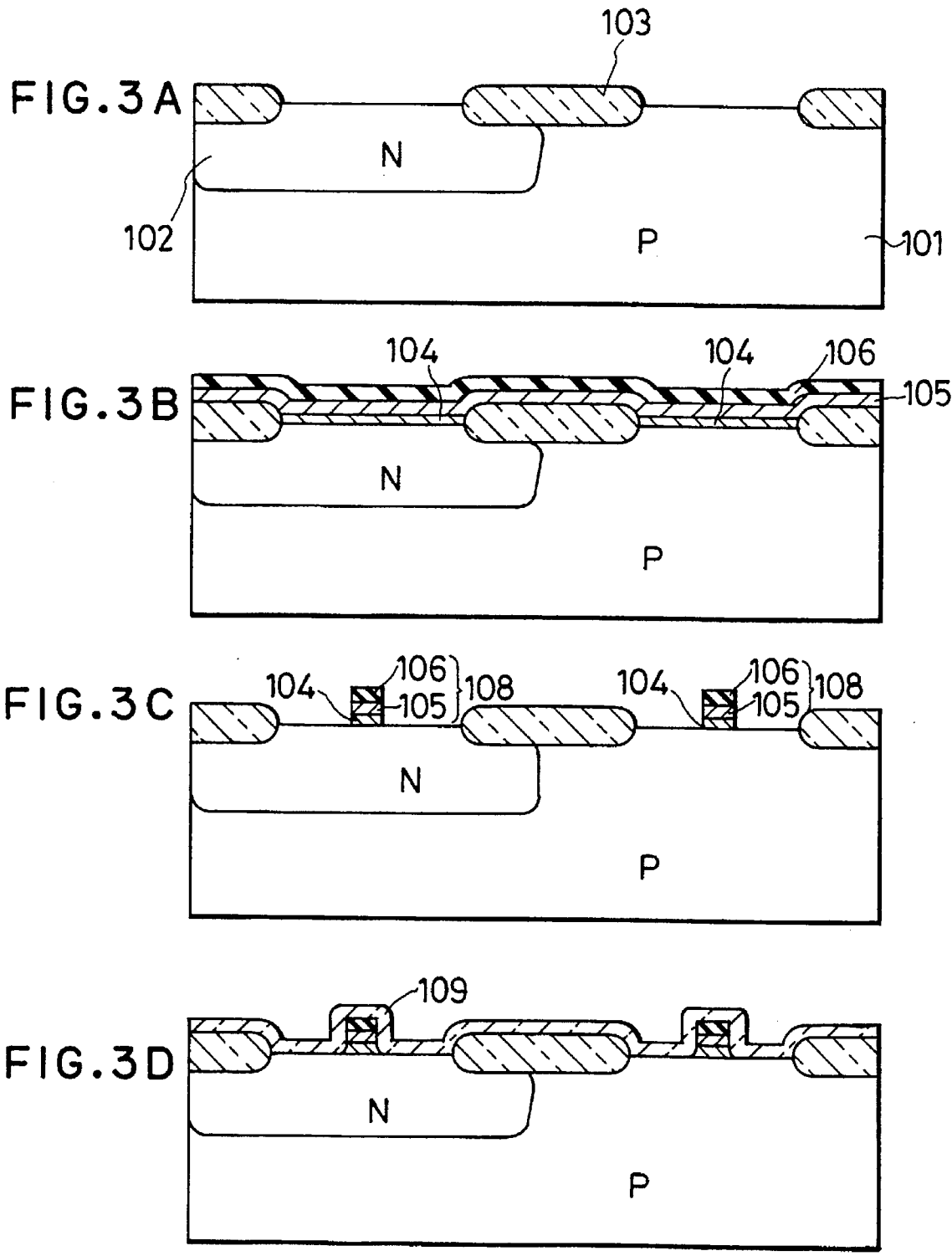

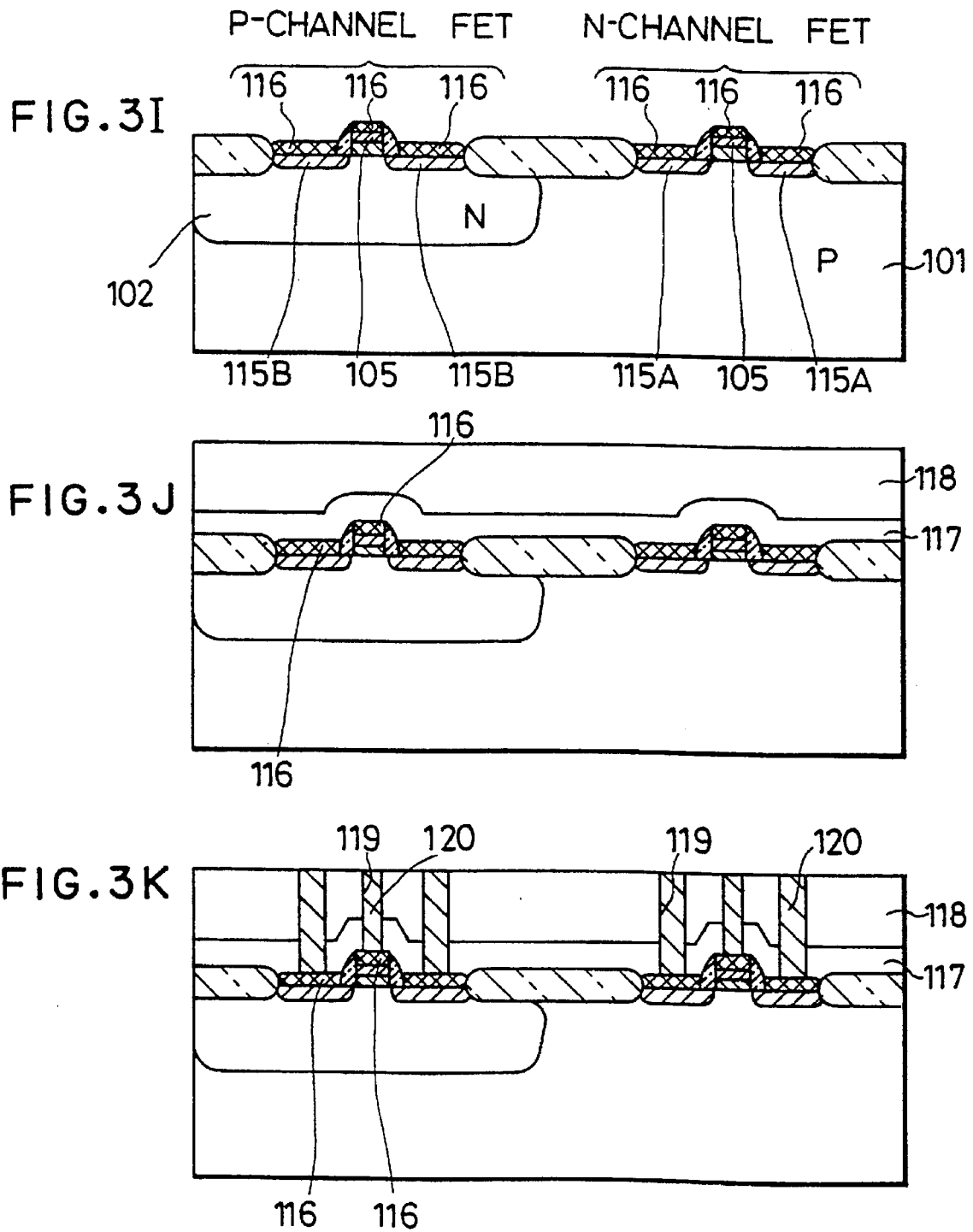

METHOD OF FABRICATING SEMICONDUCTOR DEVICE HAVING LOW-RESISTANCE GATE ELECTRODE AND DIFFUSION LAYERS

BACKGROUND OF THE INVENTION

1. Field of the Invention

The invention relates to a method of fabricating a semiconductor device, and more particularly to such a method by which it is possible to decrease resistance of a gate electrode and source/drain.

2. Description of the Related Art

These days, a gate electrode tends to be more micro-sized and an impurity diffusion layer or source/drain region tends to have a shallower junction depth in order to improve performance of a CMOS device and so on. Various attempts have been made in the prior art to decrease resistance of a gate electrode and an impurity diffusion layer. One of the prior art methods is to form a film composed of refractory metal or refractory metal silicide on both the gate electrode and impurity diffusion layer.

For instance, Japanese Unexamined Patent Publication No. 3-288443 has suggested a method of forming a sidewall having a higher height than a polysilicon gate electrode to thereby prevent short-circuiting between a gate electrode and source/drain regions. Hereinbelow is explained this prior method with reference to FIGS. 1A to 1G which are cross-sectional views of a semiconductor device, showing respective steps of the method.

First, as illustrated in FIG. 1A, a plurality of field oxides 603 are selectively formed by selective oxidation on a p-type single crystal silicon substrate 601. Then, gate oxides 604 are deposited by thermal oxidation in device formation regions surrounded by the field oxides 603. Then, a polysilicon film 605 is deposited over the field oxides 603 and the gate oxides 604 by low-pressure chemical vapor deposition (LPCVD), followed by diffusion of phosphorus into the polysilicon film 605. Then, a silicon nitride film 607 is deposited over the polysilicon film 605 by low pressure chemical vapor deposition (LPCVD), as illustrated in FIG. 1B.

Then, as illustrated in FIG. 1C, both the silicon nitride film 607 and the polysilicon film 605 are patterned by a conventional process to thereby form a gate electrode 608 onto the gate oxide 604. As is obvious, the gate electrode 608 consists of the polysilicon film 605 and the silicon nitride film 607 deposited on the polysilicon film 605.

Then, as illustrated in FIG. 1D, arsenic (As) ions are implanted into the p-type silicon substrate 601 at opposite sides of the gate electrode 608 to thereby form diffusion layers 611 acting as source/drain regions.

Then, an insulating film composed of phosphorus silicate glass (PSG) or non-doped silicate glass (NSG) is deposited all over a resultant by normal pressure CVD, followed by anisotropic etching of the insulating film to thereby form a sidewall 609 around a sidewall of the gate electrode 608, as illustrated in FIG. 1E. Then, thermal annealing is carried out at 900° C. for 30 minutes to thereby activate the source/drain regions 611.

Then, as illustrated in FIG. 1F, the silicon nitride film 607 deposited on the polysilicon film 605 is removed with heated phosphoric acid. Thus, the sidewall 609 projects above the gate electrode 608 now consisting of the polysilicon film 605.

Then, after the silicon substrate 601 has been washed with aqueous HF solution, a titanium (Ti) film is deposited all over a resultant, followed by lamp annealing in argon (Ar) gas at 600° C. for 30 seconds. A portion of the titanium film being in direct contact with the polysilicon film 605 and the source/drain regions 611 is silicided by the lamp annealing, thereby there being formed a titanium silicide ($TiSi_2$) film 614 covering the polysilicon film 605 and the source/drain regions 611, as illustrated in FIG. 1G. A portion of the titanium film located on the sidewall 609 and the field oxides 603 remains non-silicided. Then, the non-silicided portion of the titanium film is removed with mixture solution including ammonia, hydrogen peroxide and water.

Thereafter, a conventional process is carried out to complete a semiconductor device. In brief, an interlayer film such as a BPSG film is deposited over a resultant, followed by thermal treatment to carry out planarizing the BPSG film. Then, after a contact hole reaching the gate electrode has been formed, an aluminum film including silicon therein at 1% is deposited, followed by patterning the aluminum film to thereby form a wiring.

In the above mentioned method, although an upper insulating film of the gate electrode 608 comprises a silicon nitride film, refractory nitride such as TiN and ZrN or refractory carbide such as TiC and ZrC may be used in place of the nitride film, in which case it is said in the Publication No. 3-288443 that mixture solution consisting of sulfuric acid and hydrogen peroxide may be used for removal of the upper insulating film of the gate electrode. It is also said that a is zirconium (Zr) film, a hafnium (Hf) film or a cobalt (Co) film may be used in place of a titanium film to be used as a metal film for the formation of a silicide film.

As mentioned earlier, the method includes the steps of forming a gate electrode having a two-layered structure, forming a sidewall around a sidewall of the gate electrode, and removing an upper insulating film of the gate electrode, to thereby cause the sidewall to project above the gate electrode now consisting of a lower layer or a polysilicon film. This structure suppresses horizontal growth of silicide while a silicide film is being deposited to thereby make it possible to prevent short-circuiting between a gate electrode and source/drain regions.

On the other hand, the inventors of the present invention have invented and filed the other method of projecting a sidewall above a polysilicon gate electrode in Japanese Patent Application No. 6-245740. Hereinbelow is explained the method with reference to FIGS. 2A to 2F which are cross-sectional views of a semiconductor fabrication method, showing respective step of the method. However, it should be noted that Japanese Patent Application No. 6-245740 is not yet published and does not constitute prior art to the present invention. The citation of the Application herein does not mean that the inventors admit the Application as prior art, and is done merely for better understanding of the present invention.

First, as illustrated in FIG. 2A, a plurality of field oxides 703 are formed by selective oxidation on a silicon substrate 701, followed by deposition of a gate oxide 704 in device formation region surrounded by the field oxides 703.

Then, as illustrated in FIG. 2B, there is deposited a polysilicon film 705 on the gate oxide 704, and subsequently a phosphorus silicate glass (PSG) film 707 is deposited on the polysilicon film 705 by 200 nanometers thickness by normal pressure chemical vapor deposition.

Then, as illustrated in FIG. 2C, the PSG film 707 and the polysilicon film 705 are successively, selectively etched for removal by photolithography and reactive ion etching (RIE). Thus, there is formed a gate electrode 708 consisting of the residual two films 707 and 705.

Then, as illustrated in FIG. 2D, at a sidewall of the gate electrode 708 is formed a sidewall 709 composed of silicon nitride by CVD and anisotropic etching. Then, impurities are ion-implanted into the silicon substrate 701 at opposite sides of the gate electrode 708 by using the field oxides 703, the two-layered gate electrode 708 and the sidewall 709 as a mask, to thereby form diffusion layers 711 acting as source/drain regions.

Then, as illustrated in FIG. 2E, the silicon substrate 701 is exposed to hydrofluoric anhydride vapor in a vacuum chamber to thereby selectively remove only an upper layer of the two-layered gate electrode 708, namely the PSG film 707. Thus, the sidewall 709 projects above an exposed surface of the polysilicon gate electrode 705 by 200 nanometers.

Then, as illustrated in FIG. 2F, there are selectively deposited tungsten (W) films 714 only on both the source/drain regions 711 and the polysilicon gate electrode 705 surrounded with the sidewall 709.

In the prior method having been explained with reference to FIGS. 1A to 1G, the silicon nitride film 607 is used as an upper insulating film of the gate electrode 608 in order to cause the sidewall 609 to project above the gate electrode 608 consisting only of the polysilicon film 605, and the silicon nitride film 607 is removed with heated phosphoric acid after the formation of the sidewall 609. In general, since PSG or NSG of which the sidewall 609 is composed has a low selectivity ratio to heated phosphoric acid, it is quite difficult to cause the sidewall 609 to project above the gate electrode 608 when the silicon nitride film 607 is to be removed with heated phosphoric acid. A general etching rate of a thermal oxide film when etched with heated phosphoric acid is about 0.1 nm/min, and hence the thermal oxide film is scarcely etched. However, an oxide film used in the prior method contains much of the impurities having been involved thereinto in ion-implantation, and is composed of PSG or NSG having lower formation temperature than a thermal oxide film, and hence the oxide film used in the prior method has an etching rate of about 4 nm/min in accordance with detailed inspection by the inventors. Thus, since the silicon nitride film 607 constituting an upper insulating film of the gate electrode 608 has an etching rate of about 10 nm/min, almost zero selectivity ratio is obtained.

In addition, a thickness of the sidewall has to become thinner as a more micro-sized semiconductor device is required. In particular, an upper end of the sidewall has a thinner thickness, and thus, the sidewall is isotropically etched in over-etching of the silicon nitride film, resulting in that it is difficult to cause the sidewall to project above the polysilicon gate electrode 608.

Furthermore, the diffusion layers 611 are also etched with heated phosphoric acid, resulting in that a surface of the silicon substrate 601 is made to be roughened.

In the case that an upper insulating layer of a two-layered gate electrode is to be composed of refractory nitride such as titanium nitride (TiN) and zirconium nitride or refractory carbide such as titanium carbide and zirconium carbide, there would arise a problem of contamination by metal caused by particles to be produced in the formation of the upper insulating layer or caused in subsequent ion-implantation and/or thermal annealing. Such contamination by metal causes many problems to arise in a salicidation process as follows: a silicide film is formed also on insulating films or field oxides, and hence a portion of an unreacted titanium film remains non-etched when the unreacted titanium film is to be etched; and the selectivity is deteriorated in selective growth of a refractory metal film, thereby the refractory metal film being formed also on insulating films or field oxides with the result of deteriorated mass-productivity.

On the other hand, in the method having been explained with reference to FIGS. 2A to 2F, after the sidewall 709 has been formed by etching the polysilicon film 705 and the PSG film 707 into the two-layered gate electrode 708, only the PSG film 707 is etched for removal to thereby cause the sidewall 709 to project above the polysilicon film 705. Thus, the method of FIGS. 2A to 2F does not have such problems as found in the prior method of FIGS. 1A to 1G.

However, it has been found through studies having been made after the filing of Japanese Patent Application No. 6-245740 that the method suggested therein might cause other problems as follows. When a PSG film is to be selectively etched with hydrofluoric anhydride vapor, phosphoric acid ($H_3PO_4$) is produced in liquid form out of the etched PSG film. The liquid phosphoric acid is easily dissolved in hydrofluoric acid (HF). Thus, since a silicon nitride film of which the sidewall 709 is composed has high wettability to phosphoric acid, the liquid phosphoric acid containing HF therein flows on the silicon nitride film, namely the sidewall 709, and may reach silicon regions in which the diffusion layers 611 are to be formed and further the field oxides 703 acting as device isolation regions. As a result, the field oxides 703 may be etched with HF dissolved in the liquid phosphoric acid. It is possible to selectively etch the PSG film 707 in the hydrofluoric anhydride vapor etching, because the field oxides 703 have a high selectivity ratio to the PSG film 707, whereas the field oxides 703 are etched together with the PSG film 707, because the field oxides have an increased etching rate in hydrofluoric acid dissolved in the liquid phosphoric acid. Since the field oxides 703 are etched in particular in the vicinity of the sidewall 709, the tungsten film 714 also grows on an exposed surface of the silicon substrate 701 in subsequent silicidation step, resulting in that device isolation and junction leakage characteristic are degraded. If the reaction such as mentioned above further progresses, the gate oxide 704 is also etched with the result that it is almost impossible to fabricate a semiconductor device.

SUMMARY OF THE INVENTION

It is an object of the present invention to provide a method of fabricating a semiconductor device by which it is easy to cause a sidewall to have higher height than a lower film of a gate electrode to thereby form low-resistance gate electrode and diffusion layers, resulting in that there does not occur short-circuiting between the gate electrode and the diffusion layers, and by which device isolation regions and diffusion layers are not harmfully influenced when such a sidewall is to be formed.

The present invention provides a method of fabricating a semiconductor device, including the steps of (a) forming gate oxides on active regions of a semiconductor substrate separated by device isolation regions, (b) depositing an amorphous silicon film or a polysilicon film over the gate oxides and device isolation regions, (c) depositing a removable space-forming film over the silicon film, the space-forming film having a sufficient selectivity ratio to both a silicon nitride film and the device isolation regions, (d) patterning the space-forming film and the silicon film into the same shape to form a gate electrode having the thus patterned space-forming film and silicon film, (e) depositing a silicon nitride film, (f) etching the silicon nitride film to form a first sidewall around a sidewall of the gate electrode, (g) depositing a film composed of material having low wettability to acid to be produced when the space-forming film is etched with hydrofluoric anhydride, (h) etching the low wettability film to form a second sidewall around and onto the first sidewall, (i) etching the space-forming film with hydrofluoric anhydride for removal so that the silicon film is exposed and at least the first sidewall remains unremoved among the first and second sidewalls, (j) forming source/drain regions, and (k) selectively depositing a refractory metal or metal silicide film on the silicon film and the source/drain regions.

The present invention further provides a method of fabricating a semiconductor device, including the steps of (a) forming gate oxides on active regions of a semiconductor substrate separated by device isolation regions, (b) depositing an amorphous silicon film or a polysilicon film over the gate oxides and device isolation regions, (c) depositing a removable space-forming film over the silicon film, the space-forming film having a sufficient selectivity ratio to both a silicon nitride film and the device isolation regions, (d) patterning the space-forming film and the silicon film into the same shape to form a gate electrode having the thus patterned space-forming film and silicon film, (e) depositing a silicon nitride film, (f) depositing a film composed of material having low wettability to acid to be produced when the space-forming film is etched with hydrofluoric anhydride, (g) etching both the silicon nitride film and the low wettability film to form both a first sidewall around a sidewall of the gate electrode and a second sidewall around and onto the first sidewall, the first sidewall being composed of the silicon nitride film and the second sidewall being composed of the low wettability film, (h) etching the space-forming film with hydrofluoric anhydride for removal so that the silicon film is exposed and at least the first sidewall remains unremoved among the first and second sidewalls, (i) forming source/drain regions, and (j) selectively depositing a refractory metal or metal silicide film on said silicon film and said source/drain regions.

The present invention still further provides a method of fabricating a semiconductor device, including the steps of (a) forming a gate electrode on a semiconductor substrate, the gate electrode having layered structure including a space-forming film on top thereof, (b) forming a first sidewall around a sidewall of the gate electrode, (c) forming a second sidewall around and onto the first sidewall, the second sidewall being composed of material having low wettability to acid to be produced when the space-forming film is etched with hydrofluoric anhydride, (d) etching the space-forming film with hydrofluoric anhydride for removal, (e) forming source/drain regions, and (f) selectively depositing a refractory metal or metal silicide film on the silicon film and the source/drain regions.

It is preferable that the space-forming film is composed of PSG or BPSG. In the case that the space-forming film is composed of PSG or BPSG, phosphoric acid is produced when the space-forming film is etched with hydrofluoric anhydride. Thus, it is preferable to select silicon dioxide as the material having low wettability to phosphoric acid.

The refractory metal film is composed of metal selected from tungsten (W), titanium (Ti), cobalt (Co), nickel (Ni), tantalum (Ta), hafnium (Hf), zirconium (Zr), platinum (Pt) or molybdenum (Mo). The refractory metal silicide film is composed of metal silicide selected from titanium silicide ($TiSi_2$), cobalt silicide ($CoSi_2$), nickel silicide (NiSi), tungsten silicide ($WSi_2$), tantalum silicide ($TaSi_2$), hafnium silicide ($HfSi_2$), zirconium silicide ($ZrSi_2$), platinum silicide (PtSi) or molybdenum silicide ($MoSi_2$).

The refractory metal or metal silicide film is deposited so that the refractory metal or metal silicide film has a thickness smaller than a height of the first sidewall.

The advantages obtained by the aforementioned present invention will be described hereinbelow.

In accordance with the above mentioned invention, there is formed the first sidewall composed of the silicon nitride film, and the space-forming film is etched for removal with hydrofluoric anhydride vapor in place of heated phosphoric acid in order to cause the first sidewall to project above the silicon gate electrode. Thus, the projection of the first sidewall is not crumbled when the space-forming film is etched for removal, thereby making it possible to form a refractory metal or metal silicide film on the gate electrode, which film has a thickness enough to provide a desired low resistance, without causing short-circuiting between the film and the diffusion layers. In addition, exposed surfaces of the diffusion layers acting as source/drain regions are not roughened when the space-forming film is etched for removal, there never occurs current leakage between the refractory metal or metal silicide film and the diffusion layers.

In the method of the present invention, there is formed the second sidewall composed of the material, for instance, silicon oxide, which has low wettability to liquid phosphoric acid to be produced when the space-forming film is etched for removal with hydrofluoric anhydride vapor. The second sidewall prevents the phosphoric acid containing hydrofluoric acid therein from flowing on the silicon substrate and/or the field oxides constituting device isolation regions. Thus, the field oxides are prevented from being etched. Accordingly, it is possible to avoid the field oxides from being undesirably made thin, and hence also possible to avoid deterioration of device isolation.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIGS. 3A to 3K are cross-sectional views of a semiconductor device, showing respective steps of a method to be carried out in accordance with the first embodiment of the present invention.

DESCRIPTION OF THE PREFERRED EMBODIMENTS

Preferred embodiments in accordance with the present invention will be explained hereinbelow with reference to drawings.

Figure 1A:
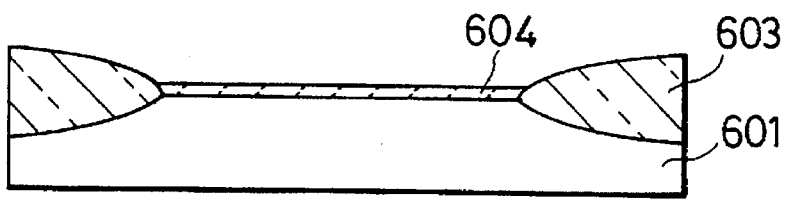
FIGS. 1A to 1G are cross-sectional views of a semiconductor device, showing respective steps of a prior method of fabricating a semiconductor device.
Figure 1B:
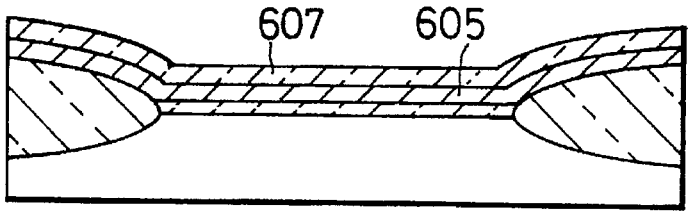
Figure 1C:
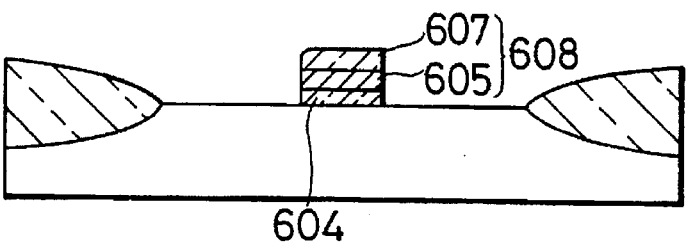
Figure 1D:
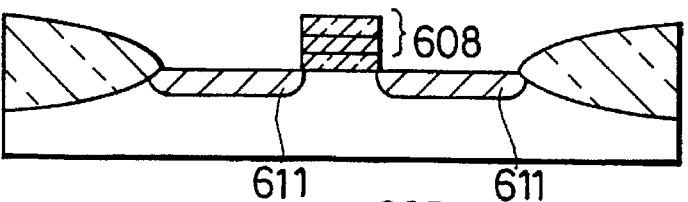
Figure 1E:
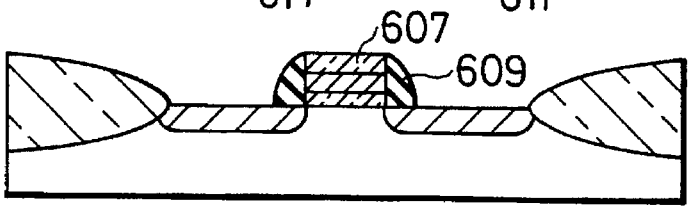
Figure 1F:
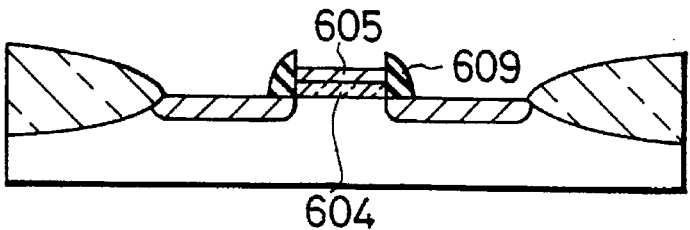
Figure 1G:
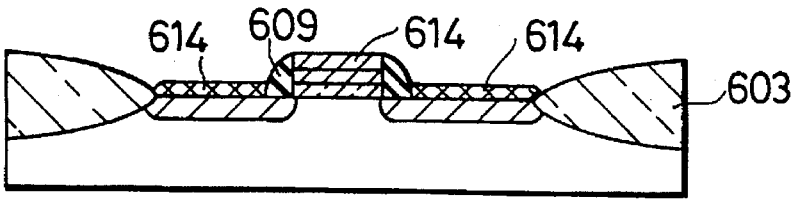
Figure 2A:
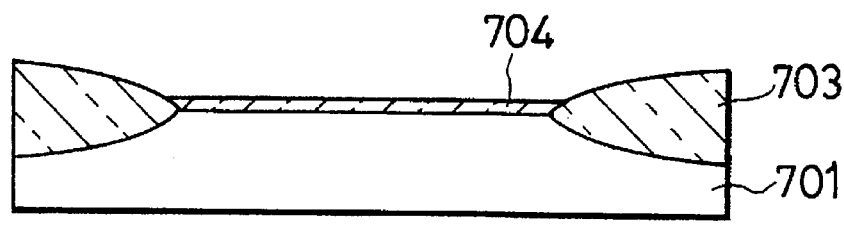
FIGS. 2A to 2F are cross-sectional views of a semiconductor device, showing respective steps of another method (non prior art) of fabricating a semiconductor device.
Figure 2B:
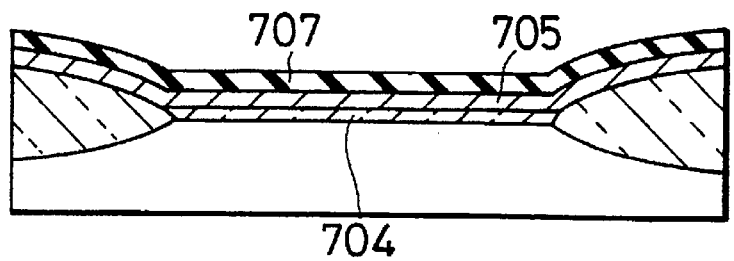
Figure 2C:
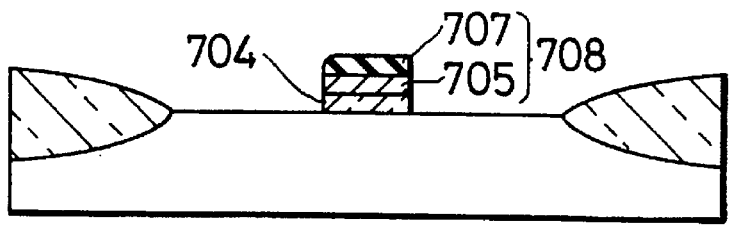
Figure 2D:
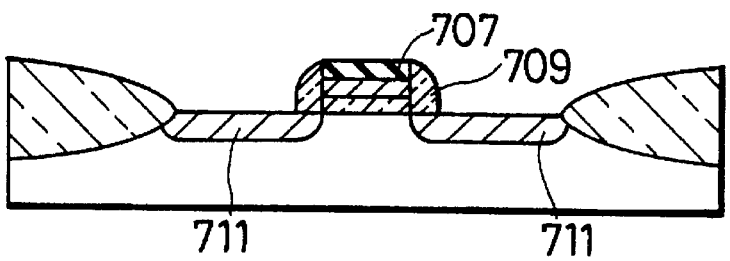
Figure 2E:
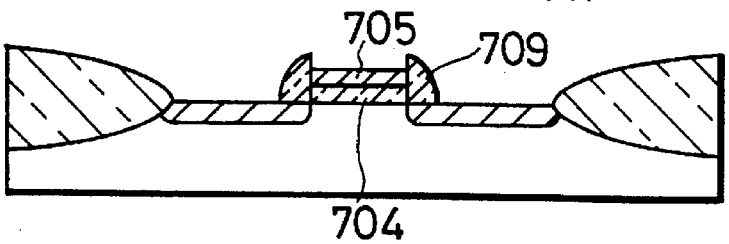
Figure 2F:
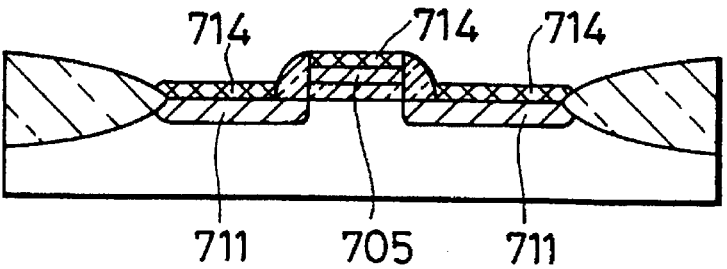
Figure 3E:
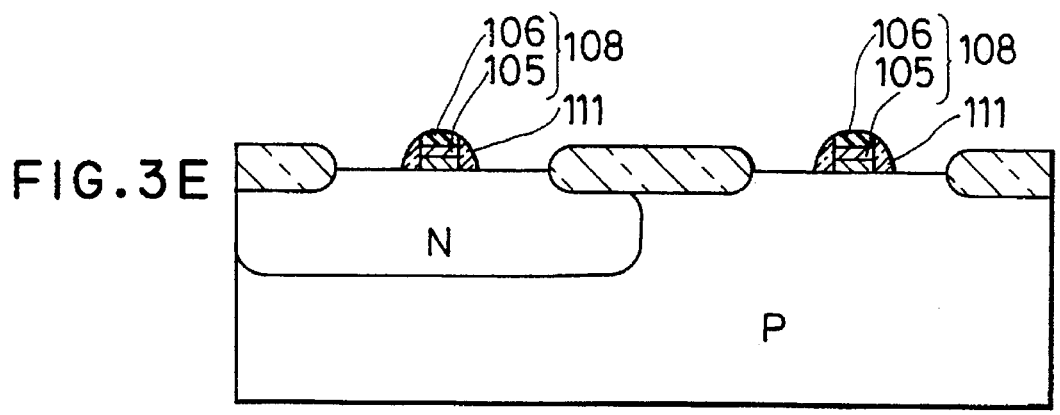

Hereinbelow will be described the first embodiment with reference to FIGS. 3A to 3K. First, as illustrated in FIG. 3A, phosphorus (P) is selectively ion-implanted into a p-type single crystal silicon substrate 101 at 150 KeV at a dose of $1 \times 10^{13}$ $cm^{-2}$, followed by thermal annealing for activation to thereby form an n-type well 102. The n-type well 102 is a region in which a p-channel FET is to be formed, and a p-type region of the silicon substrate 101 is a region in which an n-channel FET is to be formed. Thereafter, selective thermal oxidation is carried out to thereby form a plurality of field silicon oxides 103 partially buried into the silicon substrate 101. The field silicon oxides 103 act as device isolation regions.

Then, thermal oxidation is carried out to thereby grow a gate oxide 104 having a thickness of 8 nm all over both the field oxides 103 and p- and n-type principal planes of active regions surrounded by the field oxides 103. Then, a polysilicon film 105 having a thickness of 200 nm is deposited on the gate oxide 104, and further a phosphorus silicate glass (PSG) film 106 having a thickness of 200 nm is deposited on the polysilicon film 105 by normal pressure chemical vapor deposition, as illustrated in FIG. 3B. The silicon film 105 may be composed of amorphous silicon in place of polysilicon.

Then, the PSG film 106 is selectively etched by reactive ion etching (RIE) using a mask (not illustrated) formed by photolithography. Subsequently, the polysilicon film 105 is also selectively etched by RIE. Thus, the PSG film 106 and the polysilicon film 105 are patterned into the same shape to thereby form a two-layered gate electrode 108 consisting of the thus patterned PSG film 106 and polysilicon film 105, as illustrated in FIG. 3C. The polysilicon film 105 in the gate electrode 108 later constitutes a silicon gate electrode, and the PSG film 106 acts as a space-forming film which would produce a space by removing itself.

Then, as illustrated in FIG. 3D, a silicon nitride film 109 having a thickness of about 65 nm is deposited by CVD all over a resultant. The silicon nitride film 109 is deposited by carrying out thermal annealing at 750° C. in dichlorosilane (SiH$_2$Cl$_2$) gas and ammonia (NH$_3$) gas under 0.5 Torr.

Then, as illustrated in FIG. 3E, the silicon nitride film 109 is anisotropically etched with an RIE type anisotropic etcher to thereby form a first sidewall 111 around and onto a sidewall of the gate electrode 108. As a result, both an upper surface of the space-forming or PSG film 106 constituting an upper layer of the two-layered gate electrode 108 and a surface of the active regions are exposed outside. In the anisotropic etching, etching gas comprises CHF$_3$ at 25 sccm and O$_2$ at 10 sccm.

Figure 3F:
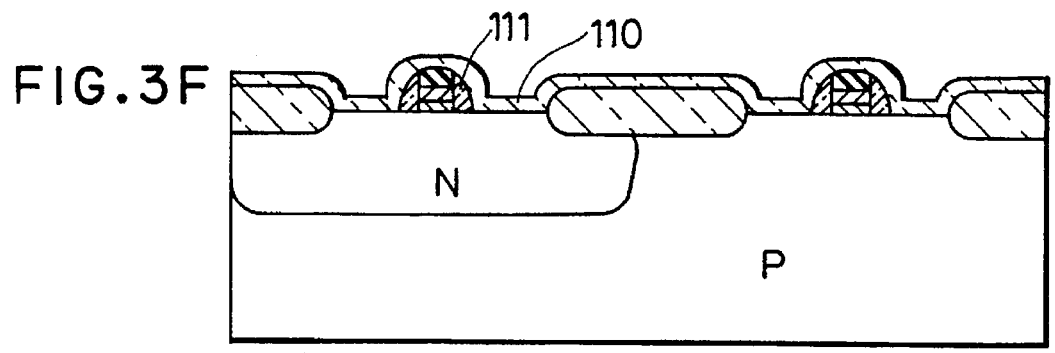

Then, as illustrated in FIG. 3F, a silicon oxide film 110 is deposited by about 30 nm all over a resultant by CVD. The silicon oxide film 110 is formed by carrying out thermal treatment at 400° C. in silane gas (SiH$_4$) and oxygen gas (O$_2$).

Figure 3G:
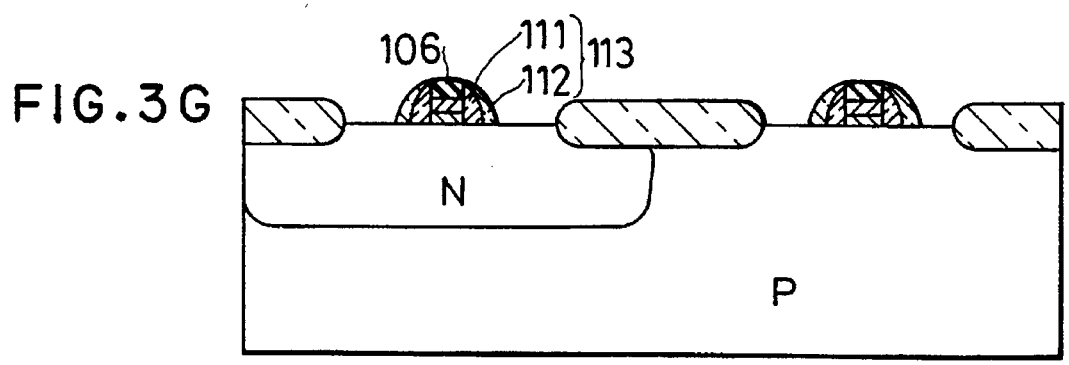

Then, the silicon oxide film 110 is anisotropically etched by using CHF$_3$ at 25 sccm and O$_2$ at 10 sccm as etching gas to thereby form a second sidewall 112 present only around the first sidewall 111, as illustrated in FIG. 3G. Thus, around a sidewall of the gate electrode 108 is formed a sidewall 113 consisting of the first sidewall 111 composed of the silicon nitride film 109 and the second sidewall 112 composed of the silicon oxide film 110 and surrounding the first sidewall 111.

Figure 3H:
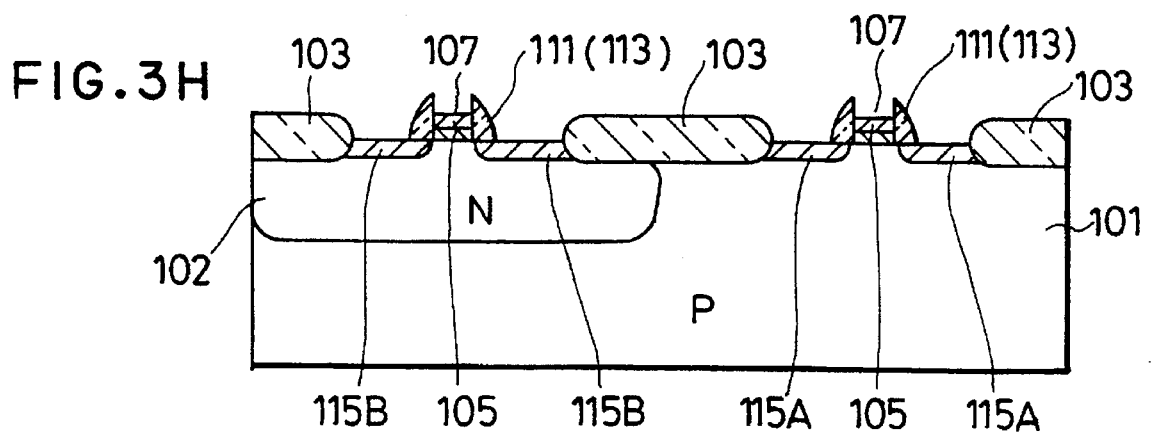

Then, the silicon substrate 101 is exposed to hydrofluoric anhydride vapor in a vacuum chamber under reduced pressure to thereby selectively remove the space-forming or PSG film 106, as illustrated in FIG. 3H. The etching of the PSG film 106 is carried out at room temperature (RM) for 180 seconds under 7 Torr in HF gas. Thus, an upper surface of the polysilicon gate electrode 105 constituting a lower layer of the two-layered gate electrode 108 is exposed outside.

The exposed surface of the polysilicon gate electrode 105 cooperates with a portion of the first sidewall 111 projecting above the polysilicon gate electrode 105 to define a space 107.

The silicon oxide film which has been formed around the first sidewall 111 and of which the second sidewall 112 is composed is etched out with hydrofluoric acid being dissolved in phosphoric acid to be produced from the PSG film 106 when etched. The thus produced phosphoric acid does not flow to the field oxides 103 due to poor wettability of the silicon oxide film to phosphoric acid, and hydrofluoric acid being dissolved in the phosphoric acid is all consumed by the silicon oxide film constituting the second sidewall 112, resulting in that the field oxides 103 are not etched. In the first embodiment, since the silicon oxide film constituting the second sidewall 112 has a thin thickness, specifically about 30 nm, the silicon oxide film is all etched out in the step of etching the PSG film 106. Thus, the sidewall 113 now consists only of the first sidewall 111 composed of the silicon nitride film 109.

Then, a silicon oxide film (not illustrated) is deposited over both the polysilicon film 105 constituting the gate electrode and the n- and p-type active regions. Then, regions in which a p-channel PET is to be fabricated are covered with a mask (not illustrated), followed by arsenic (As) ion-implantation into regions in which an n-channel PET is to be fabricated at 100 KeV at a dose of $1\times10^{15}$ cm$^{-2}$. Subsequently, regions in which a n-channel FET is to be fabricated are covered with a mask (not illustrated), followed by BF$_2$ ion-implantation into regions in which an p-channel PET is to be fabricated at 70 KeV at a dose of $1\times10^{15}$ cm$^{-2}$. Then, thermal annealing for activation is carried out in a nitrogen atmosphere at 1000° C. for 10 minutes to thereby form n-type impurity diffusion layers 115A, which act as source/drain regions in the n-channel PET, ranging from a p-type principal plane to inside of the p-type single crystal silicon substrate 101, and also cause the polysilicon gate electrode 105 located between the diffusion layers 115A to change into an n-type one. Similarly, there are formed p-type impurity diffusion layers 115B, which act as source/drain regions in the p-channel FET, ranging from an n-type principal plane to inside of the n-well 102, and the polysilicon gate electrode 105 located between the diffusion layers 115B is caused to change into p-type one.

Then, the silicon oxide film including naturally oxidized film formed on surfaces of both the impurity diffusion layers and the polysilicon gate electrode is removed with hydrofluoric acid to thereby expose those surfaces outside. Then, as illustrated in FIG. 3I, a tungsten film 116 is made to selectively grow on both the polysilicon film 105 and the impurity diffusion layers 115A and 115B by means of a CVD apparatus.

The selective growth of the tungsten film 116 is carried out as follows. First, the silicon substrate 101 is kept at 300° C., and a chamber is evacuated. Then, WF$_6$ gas at 20 sccm and Ar gas at 10 sccm are introduced into the chamber to thereby react WF$_6$ gas with silicon under 200 mTorr in accordance with the following reaction formula.

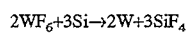

$$2WF_6 + 3Si \rightarrow 2W + 3SiF_4$$

Thus, there are formed cores of tungsten only on surfaces of the polysilicon gate electrode 105 and the diffusion layers 115A and 115B. By continuing the reaction in accordance with the above reaction formula in five seconds, those surfaces are eroded by about 15 nm, and thereafter the tungsten films 116 are formed. Then, WF$_6$, SiH$_4$ and Ar gases are introduced into the chamber at 10, 6 and 50 sccm, respectively, with the silicon substrate 101 being kept at the same temperature in the chamber to thereby reduce $WF_6$ with $SiH_4$ under 20 mTorr. As a result, the tungsten films 116 are selectively deposited only on both the polysilicon gate electrode 105 and impurity diffusion layers 115A and 115B. The tungsten films 116 can have a thickness of 200 nm at greatest.

Then, the silicon substrate 101 is transferred into a multi-chamber type plasma enhanced chemical vapor deposition (PECVD) apparatus, in which a silicon oxide film 117 having a thickness of about 100 nm is deposited over a resultant as an interlayer insulating layer by PECVD. Subsequently, the silicon substrate 101 is transferred in vacuum condition into a highly densified plasma enhanced chemical vapor deposition chamber such as ECR, in which an SiON film 118 is deposited by about 3000 nm all over the silicon oxide film 117. A film to be deposited through highly densified plasma enhanced chemical vapor deposition has superior coverage characteristic for covering unevenness. However, it is difficult even by such a film to cover unevenness produced due to a gate electrode. Accordingly, the silicon substrate 101 is subject to polishing by means of a chemical and mechanical polishing (CMP) device to thereby cut off raised portions produced due to a gate electrode. Thus, as illustrated in FIG. 3J, a surface of the SiON film 118 acting as an interlayer insulating film is flattened. As a result, the interlayer insulating film 118 comes to have a thickness of 2500 nm.

Then, as illustrated in FIG. 3K, there are formed a plurality of contact holes 119 by lithography and etching each of which reaches each of the tungsten films 116 having been selectively deposited on the impurity diffusion layers 115A and 115B and the polysilicon gate electrode 105. Since the tungsten films 116 have a high selectivity ratio to the insulating films 118 and 117, the tungsten films 116 are unlikely to be etched when the contact holes 119 are formed. Thus, the tungsten films 116 provide an advantage that contact holes having high dimensional accuracy can be formed. Then, metal is buried in the contact holes 119 for electrical connection between the tungsten films 116 and wirings to be formed on the interlayer insulating layer 118. For instance, selective growth of a tungsten film 120 is carried out to bury such metal in the contact holes 119.

In accordance with the first embodiment having been described so far, it is possible to form the sidewall 111 so that the sidewall 111 has higher height than or projects above the polysilicon gate electrode 105. In addition, the tungsten films 116 are deposited on the gate electrode and source/drain regions so that the tungsten films 116 have a thickness smaller than the height of the sidewall 111. Thus, the first embodiment provides an advantage of providing a low resistance gate electrode and source/drain regions without occurrence of short-circuiting.

Hereinbelow is explained the second embodiment of the present invention with reference to FIGS. 4A to 4I. Parts or elements of the second embodiment which correspond to those of the first embodiment have been provided the same reference numbers, and hence, will not be explained in detail or not explained at all.

Figure 4A:
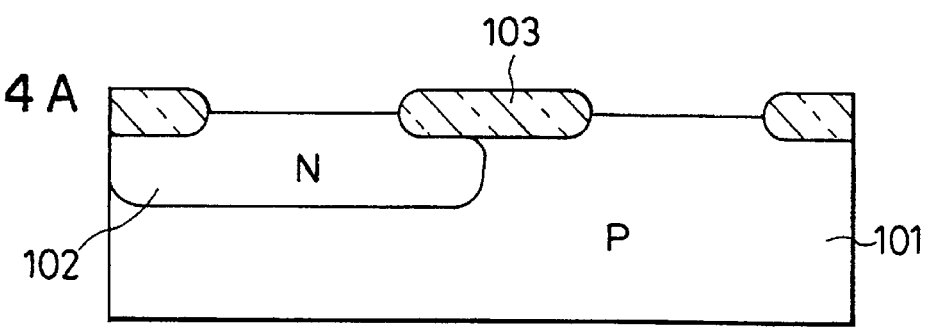
FIGS. 4A to 4I are cross-sectional views of a semiconductor device, showing respective steps of a method to be carried out in accordance with the second embodiment of the present invention.
Figure 4B:
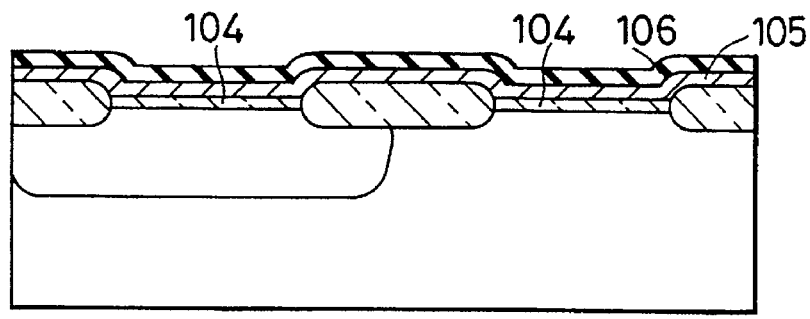
Figure 4C:
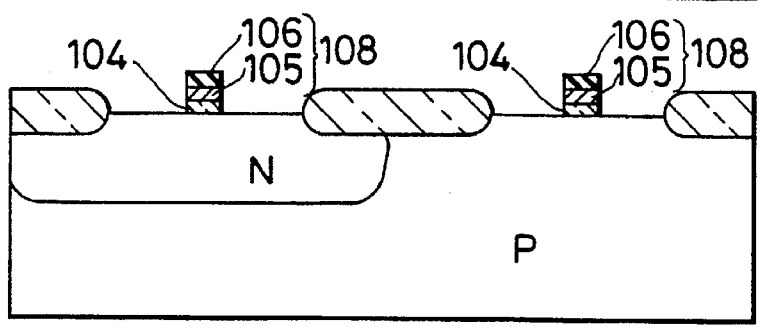

Steps shown in FIGS. 4A to 4C are the same as the steps shown in FIGS. 3A to 3C. Steps shown in FIGS. 4D to 4I are different from the steps shown in FIGS. 3D to 3K.

Figure 4D:
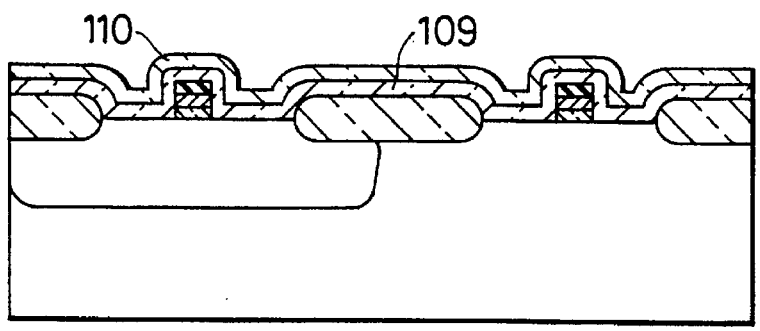

As illustrated in FIG. 4D, the silicon nitride film 109 having a thickness of about 65 nm is deposited all over a resultant by CVD at 750° C. under 0.5 Torr in etching gas comprising dichlorosilane ($SiH_2Cl_2$) and ammonia ($NH_3$) gases. Then, the silicon oxide film 110 having a thickness of about 100 nm is deposited all over the silicon nitride film 109 by CVD at 400° C. in etching gas comprising silane ($SiH_4$) and oxygen ($O_2$) gases.

Figure 4E:
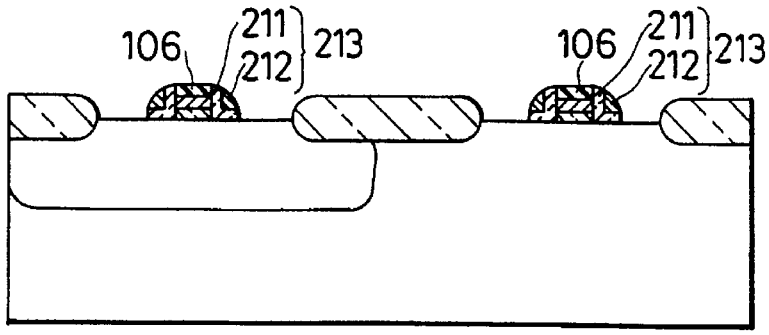

Then, as illustrated in FIG. 4E, RIE type anisotropic etching is carried out to both the silicon nitride film 109 and the silicon oxide film 110 to thereby form a sidewall 213 consisting of a first sidewall 211 surrounding the gate electrode 108 and a second sidewall 212 located adjacent to the first sidewall 211. In the second embodiment, the first sidewall 211 composed of the silicon nitride film 109 and the second sidewall 212 composed of the silicon oxide film 110 are concurrently formed by the above mentioned anisotropic etching unlike the first embodiment. Namely, the first and second sidewalls 211 and 212 can be formed by a single anisotropic etching. Hence, the first sidewall 211 covers both an entire sidewall of the gate electrode 108 and a portion of a surface of the silicon substrate 101, whereas the second sidewall 212 does not cover the sidewall of the gate electrode 108 and the surface of the silicon substrate 101, but adheres only to an outer surface of the first sidewall 211.

Figure 4F:
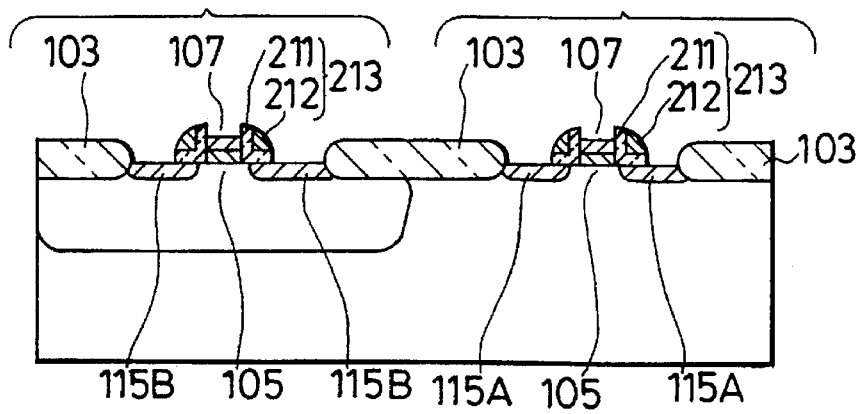

Then, as illustrated in FIG. 4F, the space-forming or PSG film 106 is etched for removal with hydrofluoric acid to thereby form the space 107, similarly to the step shown in FIG. 3H in the first embodiment. During the etching, the second sidewall 212 composed of the silicon oxide film prevents phosphoric acid containing hydrofluoric acid therein from flowing to the field oxides 103.

Since the silicon oxide film 110 constituting the second sidewall 212 in the second embodiment has a greater thickness (100 nm) than the silicon oxide film (30 nm) in the first embodiment, the second sidewall 212 remains unremoved even by the hydrofluoric anhydride vapor etching, though the second sidewall 212 becomes thinner. Thus, the sidewall 213 remains consisting of the first and second sidewalls 211 and 212 hereinafter unlike the first embodiment in which the sidewall 113 consists only of the first sidewall 111 after the hydrofluoric anhydride vapor etching.

Figure 4G:
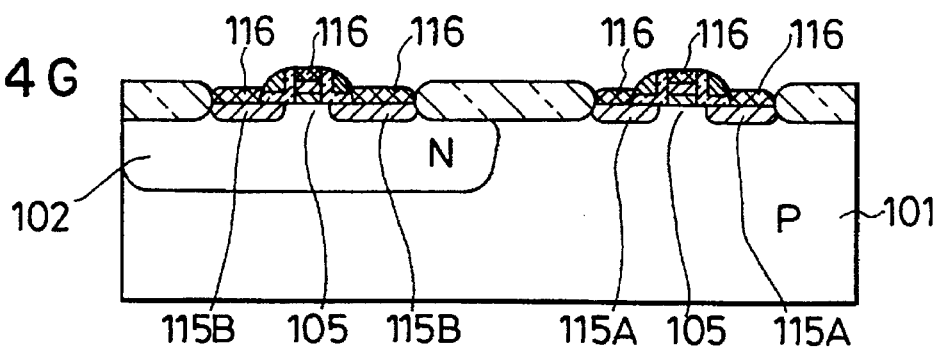
Figure 4H:
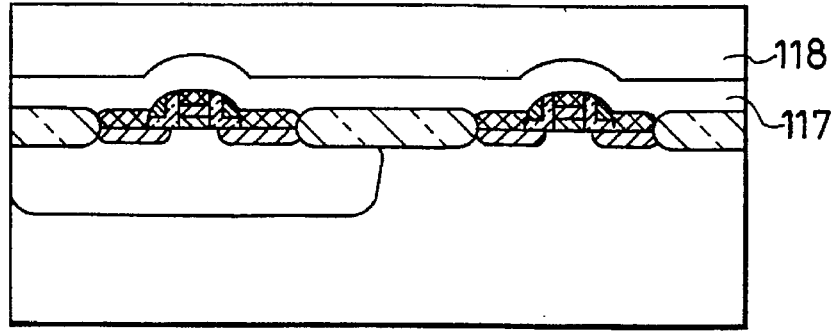
Figure 4I:
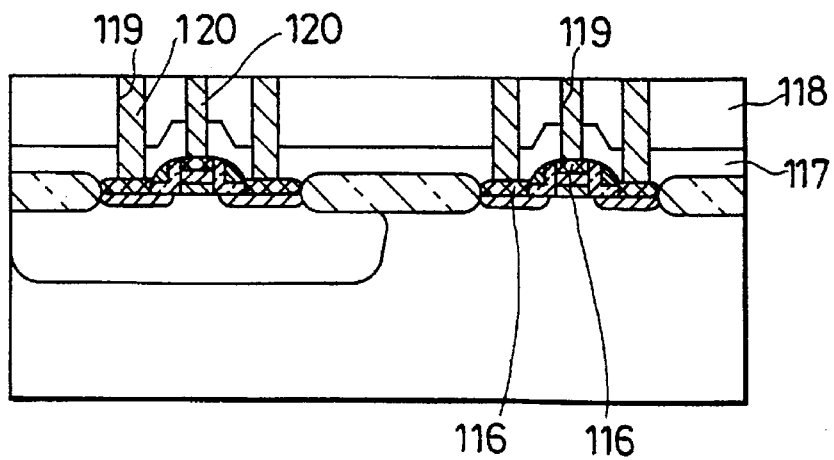

Subsequent steps shown in FIGS. 4G to 4I are the same as the steps shown in FIGS. 3I to 3K in the first embodiment.

The second embodiment can decrease the number of anisotropic etchings for the formation of the sidewall by one relative to the first embodiment.

In the first and second embodiments, the tungsten films 116 are formed by selective growth on both the silicon gate electrode and the source/drain regions. However, it should be noted that other refractory metals than tungsten may be used, and that a refractory silicide film such as $TiSi_2$ may be formed by salicidation process in place of refractory metals such as tungsten.

In addition, a glass film other than the PSG film may be used as the space-forming film 106. For instance, a BPSG film may be substituted for the PSG film 106.

While the present invention has been described in connection with certain preferred embodiments; it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A method of fabricating a semiconductor device, comprising the steps of:
   (a) forming gate oxides on active regions of a semiconductor substrate separated by device isolation regions;
   (b) depositing an amorphous silicon film or a polysilicon film over said gate oxides and device isolation regions;
   (c) depositing a removable space-forming film over said silicon film, said space-forming film having a sufficient selectivity ratio to both a silicon nitride film and said device isolation regions;
   (d) patterning said space-forming film and said silicon film into the same shape to form a gate electrode comprising the thus patterned space-forming film and silicon film;

(e) depositing a silicon nitride film;

(f) etching said silicon nitride film to form a first sidewall around a sidewall of said gate electrode;

(g) depositing a film composed of material having low wettability to acid to be produced when said space-forming film is etched with hydrofluoric anhydride;

(h) etching said low wettability film to form a second sidewall around and onto said first sidewall;

(i) etching said space-forming film with hydrofluoric anhydride for removal so that said silicon film is exposed and at least said first sidewall remains unremoved among said first and second sidewalls;

(j) forming source/drain regions; and (k) selectively depositing a refractory metal or metal silicide film on said silicon film and said source/drain regions.

2. The method as set forth in claim 1, wherein said space-forming film is composed of PSG or BPSG.

3. The method as set forth in claim 2, wherein said material in said step (g) is silicon dioxide.

4. The method as set forth in claim 1, wherein said refractory metal film is composed of metal selected from the group consisting of tungsten (W), titanium (Ti), cobalt (Co), nickel (Ni), tantalum (Ta), hafnium (Hf), zirconium (Zr), platinum (Pt) and molybdenum (Mo).

5. The method as set forth in claim 1, wherein said refractory metal silicide film is composed of metal silicide selected from the group consisting of titanium silicide ($TiSi_2$), cobalt silicide ($CoSi_2$), nickel silicide (NiSi), tungsten silicide ($WSi_2$), tantalum silicide ($TaSi_2$), hafnium silicide ($HfSi_2$), zirconium silicide ($ZrSi_2$), platinum silicide (PtSi) and molybdenum silicide ($MoSi_2$).

6. The method as set forth in claim 1, wherein said refractory metal or metal silicide film is deposited in said step (k) so that said refractory metal or metal silicide film has a thickness smaller than a height of said first sidewall.

7. A method of fabricating a semiconductor device, comprising the steps of:

(a) forming gate oxides on active regions of a semiconductor substrate separated by device isolation regions;

(b) depositing an amorphous silicon film or a polysilicon film over said gate oxides and device isolation regions;

(c) depositing a removable space-forming film over said silicon film, said space-forming film having a sufficient selectivity ratio to both a silicon nitride film and said device isolation regions;

(d) patterning said space-forming film and said silicon film into the same shape to form a gate electrode comprising the thus patterned space-forming film and silicon film;

(e) depositing a silicon nitride film;

(f) depositing a film composed of material having low wettability to acid to be produced when said space-forming film is etched with hydrofluoric anhydride;

(g) etching both said silicon nitride film and said low wettability film to form both a first sidewall around a sidewall of said gate electrode and a second sidewall around and onto said first sidewall, said first sidewall being composed of said silicon nitride film and said second sidewall being composed of said low wettability film;

(h) etching said space-forming film with hydrofluoric anhydride for removal so that said silicon film is exposed and at least said first sidewall remains unremoved among said first and second sidewalls;

(i) forming source/drain regions; and (j) selectively depositing a refractory metal or metal silicide film on said silicon film and said source/drain regions.

8. The method as set forth in claim 7, wherein said space-forming film is composed of PSG or BPSG.

9. The method as set forth in claim 8, wherein said material in said step (f) is silicon dioxide.

10. The method as set forth in claim 7, wherein said refractory metal film is composed of metal selected from the group consisting of tungsten (W), titanium (Ti), cobalt (Co), nickel (Ni), tantalum (Ta), hafnium (Hf), zirconium (Zr), platinum (Pt) and molybdenum (Mo).

11. The method as set forth in claim 7, wherein said refractory metal silicide film is composed of metal silicide selected from the group consisting of titanium silicide ($TiSi_2$), cobalt silicide ($CoSi_2$), nickel silicide (NiSi), tungsten silicide ($WSi_2$), tantalum silicide ($TaSi_2$), hafnium silicide ($HfSi_2$), zirconium silicide ($ZrSi_2$), platinum silicide (PtSi) and molybdenum silicide ($MoSi_2$).

12. The method as set forth in claim 7, wherein said refractory metal or metal silicide film is deposited in said step (j) so that said refractory metal or metal silicide film has a thickness smaller than a height of said first sidewall.

13. A method of fabricating a semiconductor device, comprising the steps of:

(a) forming a gate electrode on a semiconductor substrate, said gate electrode having a layered structure including a space-forming film on top thereof;

(b) forming a first sidewall around a sidewall of said gate electrode;

(c) forming a second sidewall around and onto said first sidewall, said second sidewall being composed of material having low wettability to acid to be produced when said space-forming film is etched with hydrofluoric anhydride;

(d) etching said space-forming film with hydrofluoric anhydride for removal;

(e) forming source/drain regions; and (f) selectively depositing a refractory metal or metal silicide film on said gate electrode and said source/drain regions.

14. The method as set forth in claim 13, wherein said space-forming film is composed of PSG or BPSG.

15. The method as set forth in claim 14, wherein said material in said step (c) is silicon dioxide.

16. The method as set forth in claim 13, wherein said refractory metal film is composed of metal selected from the group consisting of tungsten (W), titanium (Ti), cobalt (Co), nickel (Ni), tantalum (Ta), hafnium (Hf), zirconium (Zr), platinum (Pt) and molybdenum (Mo).

17. The method as set forth in claim 13, wherein said refractory metal silicide film is composed of metal silicide selected from the group consisting of titanium silicide ($TiSi_2$), cobalt silicide ($CoSi_2$), nickel silicide (NiSi), tungsten silicide ($WSi_2$), tantalum silicide ($TaSi_2$), hafnium silicide ($HfSi_2$), zirconium silicide ($ZrSi_2$), platinum silicide (PtSi) and molybdenum silicide ($MoSi_2$).

18. The method as set forth in claim 13, wherein said refractory metal or metal silicide film is deposited in said step (f) so that said refractory metal or metal silicide film has a thickness smaller than a height of said first sidewall.

* * * * *